United States Patent [19]
Sato et al.

[11] Patent Number: 4,963,099
[45] Date of Patent: Oct. 16, 1990

[54] ELECTRICAL JUNCTION BOX

[75] Inventors: Hisashi Sato; Yukio Nishio; Hideharu Hayashi; Masaki Yamamoto; Toru Takahashi, all of Shizuoka, Japan

[73] Assignee: Yazaki Corporation, Tokyo, Japan

[21] Appl. No.: 328,419

[22] Filed: Mar. 24, 1989

[30] Foreign Application Priority Data

Mar. 25, 1988 [JP] Japan .............................. 63-38430[U]
Apr. 5, 1988 [JP] Japan .............................. 63-45235[U]

[51] Int. Cl.5 .......................... H01R 9/09; H01R 4/60
[52] U.S. Cl. ..................................... 439/76; 439/205; 439/206
[58] Field of Search ................. 439/76, 205, 206, 282, 439/322, 510, 603, 892

[56] References Cited

U.S. PATENT DOCUMENTS

| | | | |
|---|---|---|---|
| 3,478,298 | 11/1969 | Nelson | 439/205 |
| 4,299,431 | 11/1981 | Wilson et al. | 439/205 |
| 4,585,291 | 4/1986 | Noschese | 439/205 |
| 4,793,819 | 12/1988 | Berg | 439/205 |
| 4,820,172 | 4/1989 | Wolkewitz et al. | 439/76 |

Primary Examiner—Paula A. Bradley
Attorney, Agent, or Firm—Armstrong, Nikaido, Marmelstein, Kubovcik & Murray

[57] ABSTRACT

An electrical junction box comprising a case having a rib; a wiring board assembly provided in the case and comprised of an insulating board and a plurality of bus bars mounted on the insulating board, the bus bars being sandwiched between the insulating board and the rib of the case; and a drainage channel provided near the bus bars. The drainage channel comprises a cutout of the rib formed at a portion bridging the adjacent bus bars. With this structure, the water having entered the case is prevented from staying in this portion, so that it may smoothly flow through the cutout of the rib to the outside of the case. Accordingly, the generation of short circuits between the adjacent bus bars may be prevented. At least a through-hole may be formed through the insulating board at a position near the bus bars, and a gap may be defined between the bus bars and the insulating board by providing a plurality of projections on the insulating board.

4 Claims, 4 Drawing Sheets

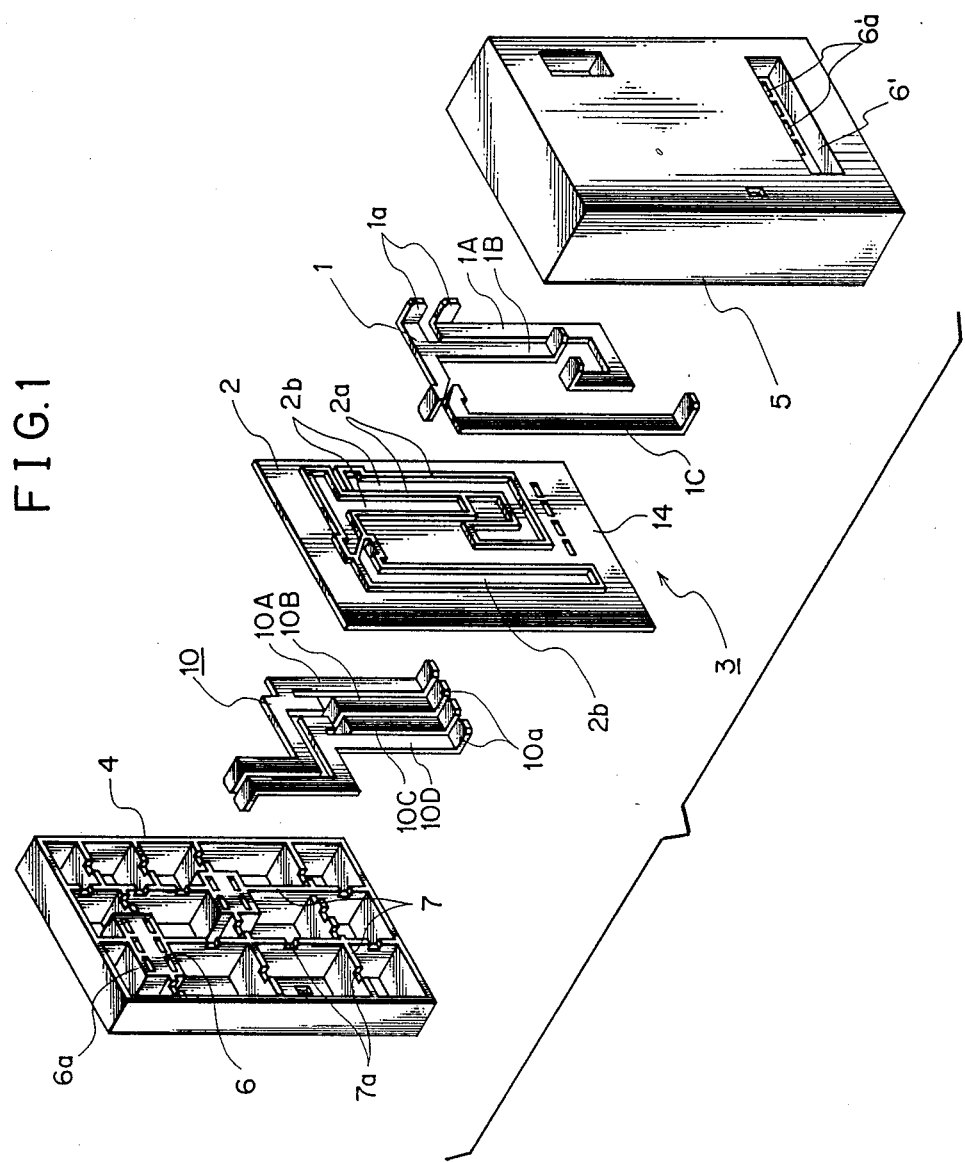

ELECTRICAL JUNCTION BOX

BACKGROUND OF THE INVENTION

The present invention relates to an electrical junction box for use with electrical wiring for an automobile or the like, and more particularly to a structure of the electrical junction box which may prevent short circuits of bus bars located in the electrical junction box due to water entering the electrical junction box.

FIG. 4 is an exploded perspective view of a conventional electrical junction box constructed of an upper cases 4, a lower case 5 and a wiring board assembly 3 to be received in the upper case 4 and the lower case 5. The wiring board assembly 3 is constructed of a first bus bar set 10 including a plurality of bus bars 10A, 10B, 10C and 10D, a second bus bar set 1 including a plurality of bus bars 1A, 1B and 1C, and an insulating board 2 to be interposed between the first bus bar set 10 and the second bus bar set 1. The upper case 4 and the lower case 5 are formed with a plurality of connector housings 6 and 6' for connecting a fuse, relay, wire harness or the like (not shown) to the bus bar sets 10 and 1, respectively. The connector housing 6 and 6' are formed with a plurality of connection holes 6a and 6'a for receiving tab terminals 10a and 1a of the bus bar sets 10 and 1, respectively. Further, the upper case 4 and the lower case 5 are formed with a plurality of crossing ribs 7 and 7', respectively.

FIG. 5 is a sectional view of a part of the electrical junction box under the assembled condition, and FIG. 6 is a cross section taken along the line VI—VI in FIG. 5. As shown in FIGS. 5 and 6, the wiring board assembly 3 comprised of the first and second bus bar sets 10 and 1 and the insulating board 2 is sandwiched between the upper and lower ribs 7 and 7' of the upper and lower cases 4 and 5. The ribs 7 and 7' serve to increase a mechanical strength of the upper and lower cases 4 and 5, and also serve to reliably fix the first and second bus bar sets 10 and 1 in a predetermined position. The insulating board 2 is formed on its opposite surfaces with pattern projections 2a corresponding to patterns of the bus bar sets 10 and 1, so that a plurality of grooves 2b are formed to receive the bus bars 10A to 10D of the bus bar set 10 and the bus bars 1A to 1C of the bus bar set 1.

A waterproof cover (not shown) is usually mounted on the upper case 4 by a locking means, so as to prevent entry of water into the electrical junction box. However, when a vehicle is washed with water under a high pressure, for example, the water tends to enter the electrical junction box through the locking means of the waterproof cover. As shown in FIGS. 5 and 6, the water having entered the electrical junction box tends to stay at a contact portion between the first bus bar set 10 and the rib 7 and a contact portion between the second bus bar set 1 and the rib 7' as depicted by W. Such stay of the water W causes the generation of leak current between the adjacent bus bars 10A and 10B, for example, or between the opposite bus bars 10A and 1A, for example. As a result, the electrical parts such as a relay connected to the bus bars will malfunction. Further, as the wiring board assembly 3 is enclosed by the ribs 7 and 7', the water W cannot flow out of the spaces between the wiring board assembly 3 and the ribs 7 and 7', causing the generating of corrosion of the bus bars. Further, the staying water W will be moved or scattered in the spaces due to vibration of the automobile to cause the generation of leak current between the other bus bars.

SUMMARY OF THE INVENTION

It is an object of the present invention to provide an electrical junction box which may prevent the water having entered the electrical junction box from staying and allow the water to smoothly flow out of the electrical junction box, thereby preventing the generation of short circuit of the bus bars.

According to the present invention, there is provided an electrical junction box comprising a case having a rib; a wiring board assembly provided in said case and comprised of an insulating board and a plurality of bus bars mounted on said insulating board, said bus bars being sandwiched between said insulating board and said rib of said case; and a drainage channel provided near said bus bars.

A preferred embodiment of the drainage channel comprises a cutout of said rib formed at a portion bridging the adjacent ones of said bus bars. With this structure, the water having entered the case is prevented from staying this portion, so that water may smoothly flow through the cutout of the rib to the outside of the case. Accordingly, the generation of short circuit between the adjacent bus bars may be prevented.

Another preferred embodiment of the drainage channel comprises at least a through-hole formed through said insulating board at a position near said bus bars. With this arrangement, the water may smoothly flow down through the through-hole of the insulating board.

A further preferred embodiment of the drainage channel comprises a gap defined between said bus bars and said insulating board by providing a plurality of projections on the insulating board. With this arrangement, the water may flow through the gap.

Other objects and features of the invention will be more fully understood from the following detailed description and appended claims when taken with the accompanying drawings.

BRIEF DESCRIPTION OF THE DRAWINGS

FIG. 1 is an exploded perspective view of a first preferred embodiment of the electrical junction box according to the present invention;

DETAILED DESCRIPTION OF THE PREFERRED EMBODIMENTS

Figure 3:
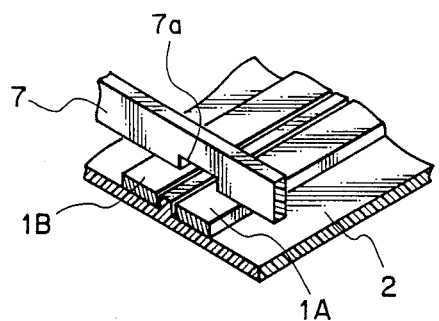
FIG. 3 is an elarged perspective view of an essential part in FIG.2.
Figure 6:
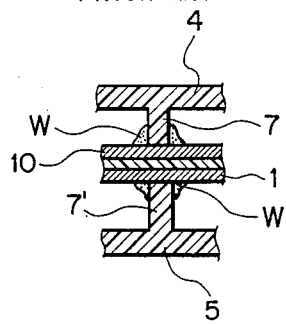
FIG. 6 is a cross section taken along the line VI—VI in FIG. 5.
Figure 5:
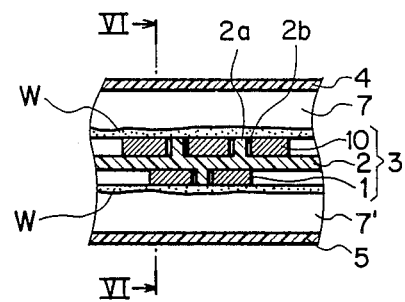
FIG. 5 is a vertical sectional view of an essential part of the prior art electrical junction box shown in FIG. 4.
Figure 4:
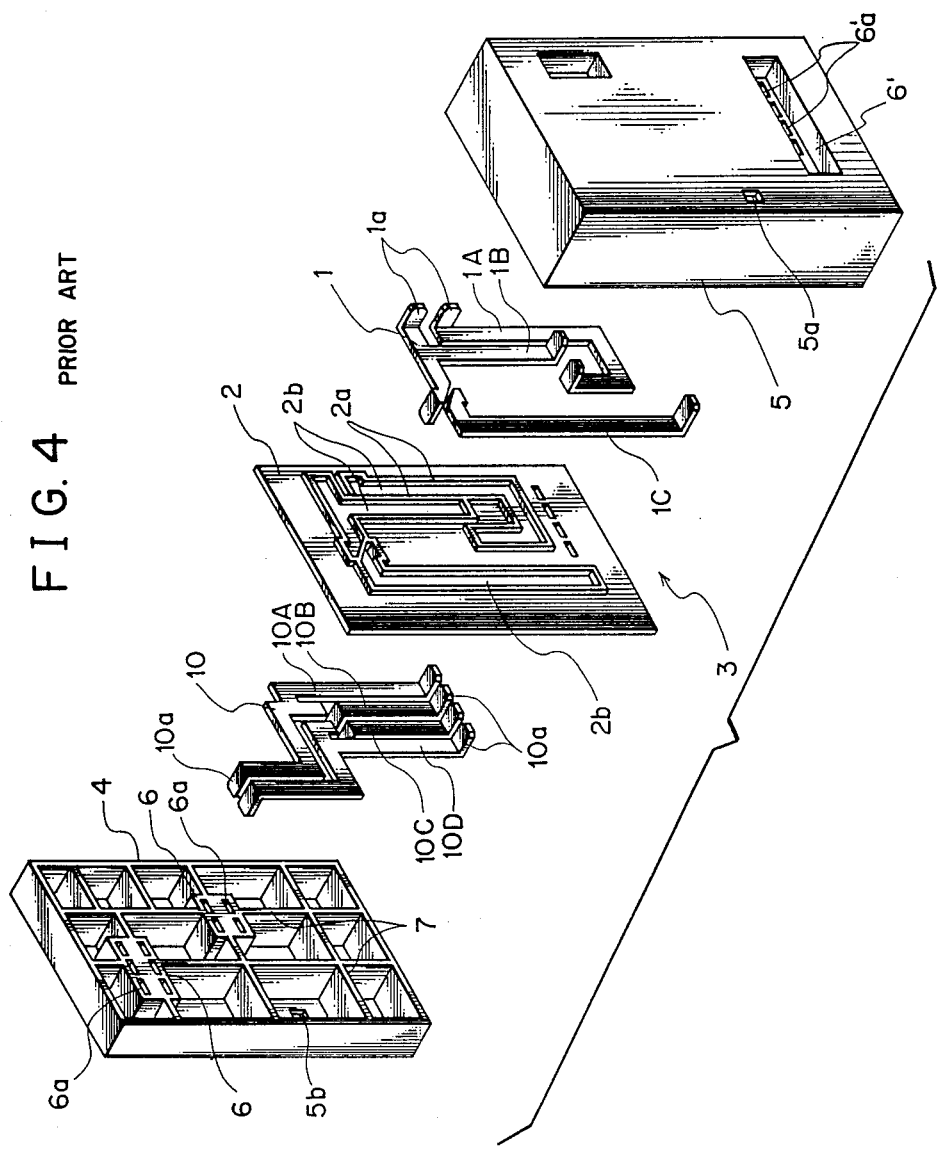
FIG. 4 is an exploded perspective view of the electrical junction box in the prior art.

There will now be described some preferred embodiments of the present invention with reference to FIGS. 1 to 3, 7 and 8, wherein the same or corresponding parts as in FIGS. 4 to 6 are designated by the same reference numerals, and the explanation thereof will be omitted hereinafter.

Figure 2:
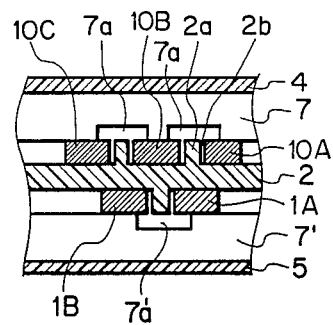
FIG. 2 is a vertical sectional view of an essential part of the electrical junction box shown in FIG. 1.

Referring first to FIGS. 1 to 3 which show a first preferred embodiment of the present invention, the rib 7 of the upper case 4 is formed with cutouts 7a in such a manner that each cutout 7a bridges the adjacent bus bars 10A and 10B, for example. Similarly, the rib 7' of the lower case 5 is formed with cutouts 7'a in such a manner that each cutout 7'a bridges the adjacent bus bars 1A and 1B, for example. Each of the cutouts 7a and 7'a is not limited in size but has a sufficient size such that a water film due to surface tension is not formed in the cutouts to allow smooth flow of water, and that the strength of the ribs 7 and 7' is not affected. With this structure, even when the water is deposited to the ribs 7 and 7' it is prevented from staying between the adjacent bus bars 10A and 10B for example, and the water is allowed to flow through the cutouts 7a and 7'a into the grooves 2b formed on the insulating board 2 by capillarity or the like. Accordingly, it is possible to prevent the generation of leak current between the adjacent bus bars 10A and 10B for example, and between the opposite bus bars 10A and 1A, for example.

Figure 7:
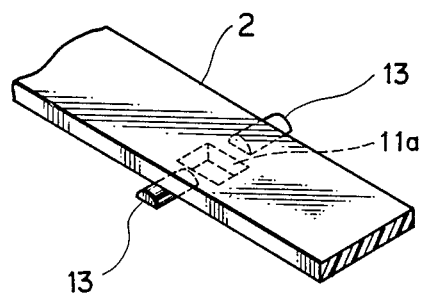
FIG. 7 is an enlarged perspective view of an essential part of a second preferred embodiment.
Figure 8:
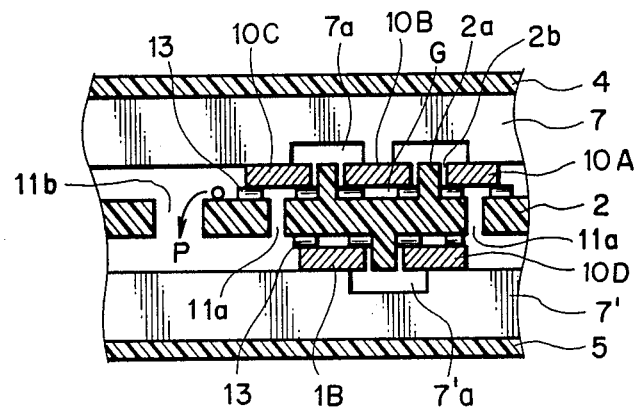
FIG. 8 is a vertical sectional view of the second preferred embodiment.

Referring next to FIGS. 7 and 8 which show a second preferred embodiment of the present invention, the insulating board 2 is formed with a through-hole 11b for drainage at any portion other than the grooves 2b, and is also formed with a plurality of through-holes 11a under some of the bus bars 10A and 10C. Furthermore, a plurality of small projections 13 are provided on the bottom of each groove 2b of the insulating board 2, so that a gap G for drainage may be defined between the opposed surfaces of the insulating board and each bus bar.

With this arrangement, even the water falls onto the insulating board 2, it is allowed to smoothly flow down through the through-holes 11a and 11b as depicted by arrow P, and the stay of the water on the insulating board 2 may be prevented. The water having flown out of the wiring board assembly 3 is discharged from a drain hole 5a formed through the lower case 5.

It is preferable to form the through-holes 11a and 11b as many as possible. Further, as the electrical junction box is usually mounted to a vehicle body or the like under an inclined condition, it is preferable to eliminate some of the ribs opposed to the facing side portion 14 of the insulating board 2 and thereby accelerate the drainage out of the case. Although the wiring board assembly 3 is singly provided in the above-mentioned preffered embodiments, the improved drainage structure mentioned above may be applied similarly to the case that a plurality of wiring board assemblies are provided.

While the invention has been described with reference to specific embodiments, the description is illustrative and is not to be construed as limiting the scope of the invention. Various modifications and changes may occur to those skilled in the art without departing from the scope of the invention as defined by the appended claims.

What is claimed is:

1. An electrical junction box comprising: a case having a rib; a wiring board assembly provided in said case and having an insulating board with a plurality of bus bars mounted on said insulating board and adjacent to one another, said bus bars being sandwiched between said insulating board and said rib of said case; and a drainage space provided in facing relation to at least one of said bus bars.

2. The electrical junction box as defined in claim 1, wherein said drainage space comprises a cutout of said rib formed at a portion bridging said adjacent bus bars.

3. The electrical junction box as defined in claim 1, wherein said drainage space comprises at least a through-hole formed through said insulating board at a position near said bus bars.

4. The electrical junction box as defined in claim 1, wherein said drainage space comprises a gap defined between said bus bar and said insulating board by providing a plurality of projections on said insulating board.

* * * * *